United States Patent [19]

Sumi

[11] Patent Number: 4,925,036
[45] Date of Patent: May 15, 1990

[54] PLATE-LIKE MEMBER SELECTING AND ACCOMMODATING APPARATUS

[75] Inventor: Sigeo Sumi, Saitama, Japan
[73] Assignee: Somar Corporation, Tokyo, Japan
[21] Appl. No.: 133,394
[22] Filed: Dec. 15, 1987
[30] Foreign Application Priority Data
  Dec. 15, 1986 [JP] Japan .................. 61-297951
[51] Int. Cl.⁵ .................................. B07C 5/00
[52] U.S. Cl. ............................ 209/552; 209/698; 209/931; 209/933
[58] Field of Search ............ 209/509, 518, 552, 606, 209/655, 698, 706, 707, 924, 931, 933; 193/32, 40; 198/534; 271/180, 181, 207, 224, 302; 414/86, 90, 91; 29/829

[56] References Cited

U.S. PATENT DOCUMENTS

| 3,411,638 | 11/1968 | Dryon | 414/90 X |
| 3,517,808 | 6/1970 | Lauer | 209/933 X |
| 3,643,798 | 2/1972 | Krupotich | 209/606 X |
| 3,907,128 | 9/1975 | Cathers | 271/224 X |
| 4,003,462 | 1/1977 | Perrott | 209/933 X |
| 4,249,663 | 2/1981 | Hewlett | 209/933 X |
| 4,441,702 | 4/1984 | Nagel et al. | 271/180 X |

FOREIGN PATENT DOCUMENTS

| 0131232 | 6/1978 | Fed. Rep. of Germany | 209/933 |
| 2831248 | 1/1980 | Fed. Rep. of Germany | 414/86 |
| 0238929 | 9/1986 | Fed. Rep. of Germany | 414/90 |
| 58-11463 | 1/1983 | Japan | 271/207 |
| 0638519 | 12/1978 | U.S.S.R. | 198/956 |
| 0889573 | 12/1981 | U.S.S.R. | 414/91 |

Primary Examiner—Margaret A. Focarino
Assistant Examiner—Edward M. Wacyra
Attorney, Agent, or Firm—Sughrue, Mion, Zinn, Macpeak & Seas

[57] ABSTRACT

A plate-like member selecting apparatus has a container for accommodating selected plate-like members, which comprises a flexible and elastic sheet-like member bent in the shape of V or U, and which is provided under a plate-like member transferring path. The side wall of the container can swing when each selected plate-like member abuts thereagainst, and the bottom of the container can accommodate each plate-like member without repulsion or impact.

9 Claims, 6 Drawing Sheets

PLATE-LIKE MEMBER SELECTING AND ACCOMMODATING APPARATUS

BACKGROUND OF THE INVENTION

This invention relates to a plate-like member selecting and accommodating apparatus for selecting defective plate-like members from a plurality of plate-like members transferred along a path to accommodate the selected defective members in a container, and more particularly to a plate-like member selecting and accommodating apparatus which is usefully from a plurality of transferred boards in the container.

A printed wiring board for an electronic device is so formed that a certain wiring pattern made of, for example, copper is printed on one surface (or both surfaces) of an insulating board. This kind of printed wiring boards can be manufactured in the following processes. First, a conductive layer is formed on an insulating board and a lamination film comprising a photosensitive layer (photoresist layer) and a transparent resin cover film (this is called a cover film hereinafter), is laminated by pressing the lamination film against the insulating board while heating it. Thereafter, a wiring pattern film is placed on the board and, thereafter, the photosensitive resin layer is exposed through the wiring pattern film and the cover film. Further, after the cover film is separated from the board, the exposed photosensitive resin layer is developed to form an etching mask pattern. Thereafter, unnecessary portions of the conductive layer are eliminated by an etching process and a residual photosensitive resin layer is eliminated to form a printed wiring board with a certain wiring pattern.

In the processes of manufacturing printed wiring boards, a cover film separation process is needed when the photosensitive layer is developed after its exposure. This cover film separation process is carried out by a workman. However, the cover film is very thin. Therefore, this process requires dexterity so as to avoid damage and breakage of the thin film due to partial existence of stress during separation of the cover film. Accordingly, there has appeared an automatic cover film (thin film) separation apparatus for carrying out the cover film separation process by a machine. In this automatic cover film separation apparatus, a part of the cover film in the lamination layer attached to the board is initially lifted from the board by a needle, a brush and a kurling tool or the like and fluid is blown onto the lifted part to automatically separate the cover film from the board. The separated cover film is transferred by a cover film transferring device connected to or accommodated in the automatic cover film separation apparatus and conveyed into a cover film accommodating container. This cover film transferring device comprises a transferring belt.

The board from which the cover film is separated is transferred to a developing device. If defective boards from which the cover films are not completely separated are produced, there is a problem that expensive boards are wasted due to occurrence of defective printed wiring boards in development. Therefore, the defective boards are sensed automatically by a sensor or the like to select them and dropped automatically downward from a transferring path. The boards which are defective because the cover film was not separated therefrom can be used because the boards themselves are not bad.

However, in the method of discharging the defective boards, there have occurred impulse sounds and damage and breakage of photosensitive resin. Further, when the defective boards are dropped onto a container with an elastic member, such as a sponge or the like, provided on the hard bottom of the container and especially when the corners of the defective board impacts the elastic member, the corner of each board is broken in pieces due to a force of the elastic member to thereby cause damage and breakage of the photosensitive resin layer on the board.

SUMMARY OF THE INVENTION

It is an object of this invention to provide a plate-like member selecting and accommodating apparatus for selecting and accommodating plate-like members such as boards or the like in which defective plate-like members such as boards or the like in which defective plate-like members detected as defective ones to be discharged can be accommodating in a plate-like member accommodated container without damage or breakage of the photosensitive resin layer of each board.

It is another object of this invention to provide a plate-like member selecting and accommodating apparatus in which defective plate-like members detected as being defective so as to be discharged can be accommodated without impulse sounds due to collision of each defective board with a receiving plate.

According to one aspect of this invention, there is provided a plate-like member selecting and accommodating apparatus for selecting certain plate-like members from a plurality of plate-like members transferred along a path on the basis of a predetermined standard and accommodating the certain selected members in a container, which comprises: (a) a container for accommodating the selected members which comprises a sheet-like member in the shape of V or U in a longitudinal section and which is provided under the path formed in a manner that an intermediate portion of the path is changeably directed downward; (b) a swinging means for swinging the side wall of the container against which the selected plate-like members abut; (c) a repulsion preventing means for preventing the selected plate-like members to be accommodated in the container from dropping repulsively onto the bottom of the container.

According to another aspect of this invention, there is provided a plate-like member selecting and accommodating apparatus for selecting certain plate-like members from a plurality of plate-like members transferred along a path on the basis of a predetermined standard and accommodating the certain selected members in a container, which comprises: (a) a container for accommodating the selected members, which comprises a sheet-like member in the shape of V or U in longitudinal section and which is provided under the path formed in a manner that an intermediate portion of the path is changeably directed downward; (b) a swinging means for swinging the side wall of the container against which the selected plate-like members abut; (c) a repulsion preventing means for preventing the selected plate like members to be accommodated in the container from dropping repulsively onto the bottom of the container; (d) at least one partition member disposed in the container; (e) a partition member driving means for driving the partition member on the basis of a certain condition.

The nature, utility, and further features of this invention will be more clearly apparent from the following detailed description with respect to preferred embodiments of the invention when read in conjunction with the accompanying drawings briefly described below.

DETAILED DESCRIPTION OF THE INVENTION

Figure 1:
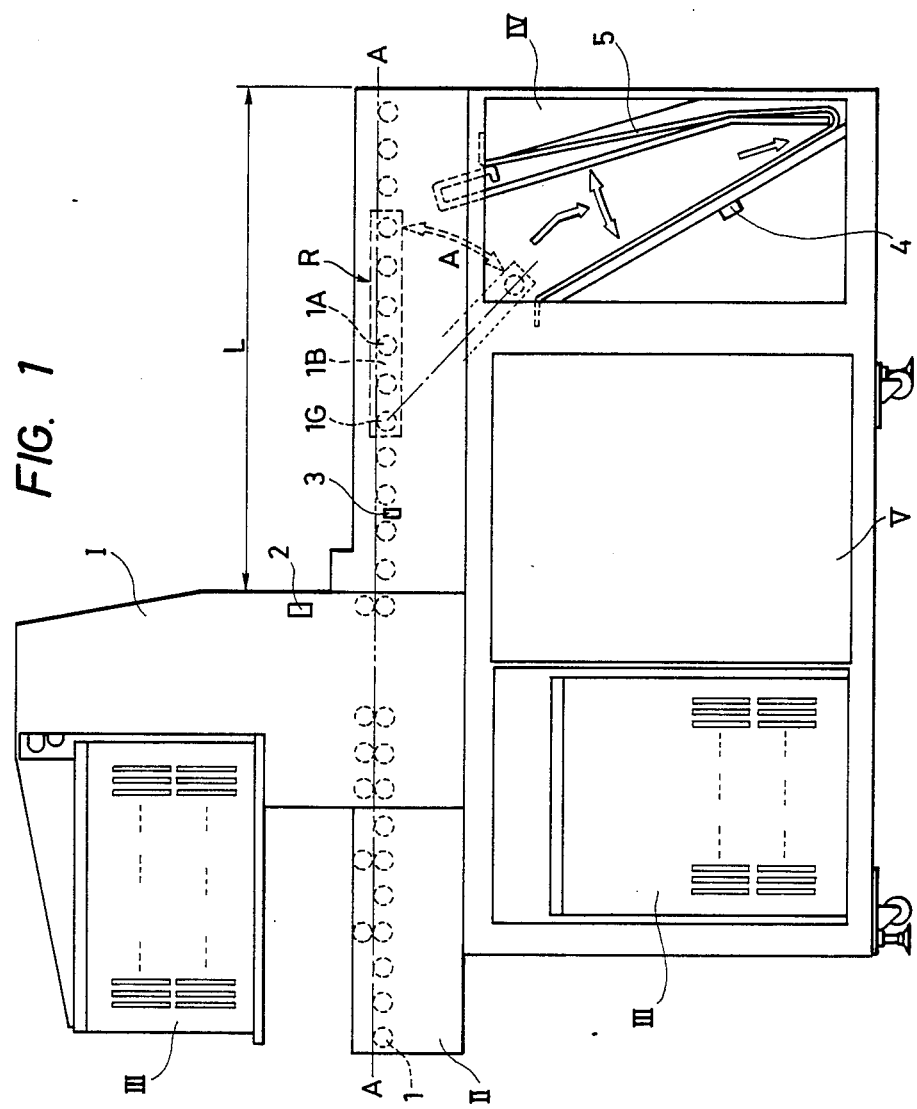
FIG. 1 is a side view showing a general construction of a cover film separation apparatus for printed wiring boards according to a first embodiment of this invention.

The following describes one embodiment in which this invention is adapted for a cover film separation apparatus for separating a cover film from a printed wiring board.

In all drawings concerning two embodiments, for simplicity, members having the same functions will be indicated by the same marks or reference numerals, respectively.

A cover film separating apparatus, according to this invention, has a cover film separating and transferring part I for separating a cover film adhered to a printed wiring board from the board and for accommodating the separated cover film in a cover film (thin film) accommodating container, a board transferring part II for transferring the printed wiring board, a cover film accommodating part III for accommodating the separated cover film, a defective board discharging part IV for detecting and discharging a defective board from which a cover film is not separated correctly, and a control part V for controlling the above parts.

In FIG. 1, the cover film separating apparatus has a plurality of driving rollers 1 whose axes are fixedly provided for transferring the printed wiring boards in the board transferring part II and a swingable roller assembly R comprising a plurality of driving rollers 1A. A cover film sensor 2 for detecting whether or not a cover film is completely separated from the printed wiring board is provided over the arrangement of the driving rollers 1. The sensor 2 comprises a photosensor or the like. Along the driving roller arrangement is disposed a sensor 3 for stopping a third one of a plurality of defective boards from which cover films are not perfectly separated. The defective board discharging part IV has a sensor 4 for detecting whether or not a first defective printed wiring board is accommodated in the container 5.

Figure 2:
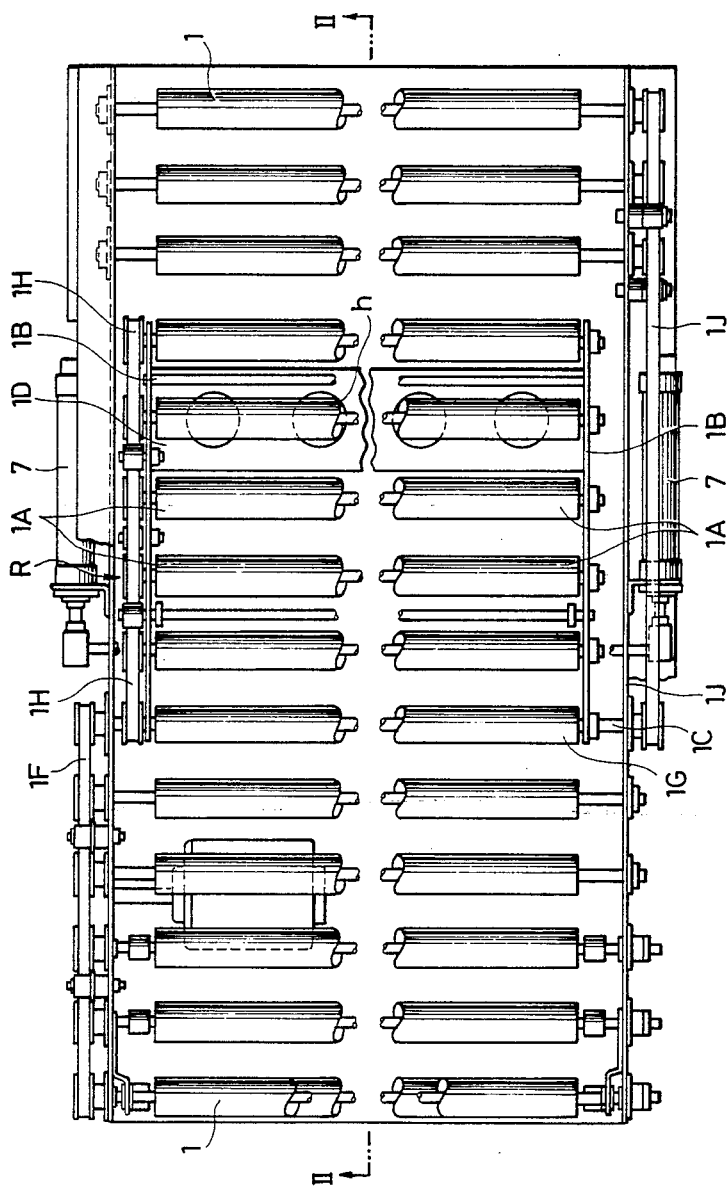
FIG. 2 is a plan view of board transferring part for transferring printed wiring boards from which cover films have been separated.
Figure 3:
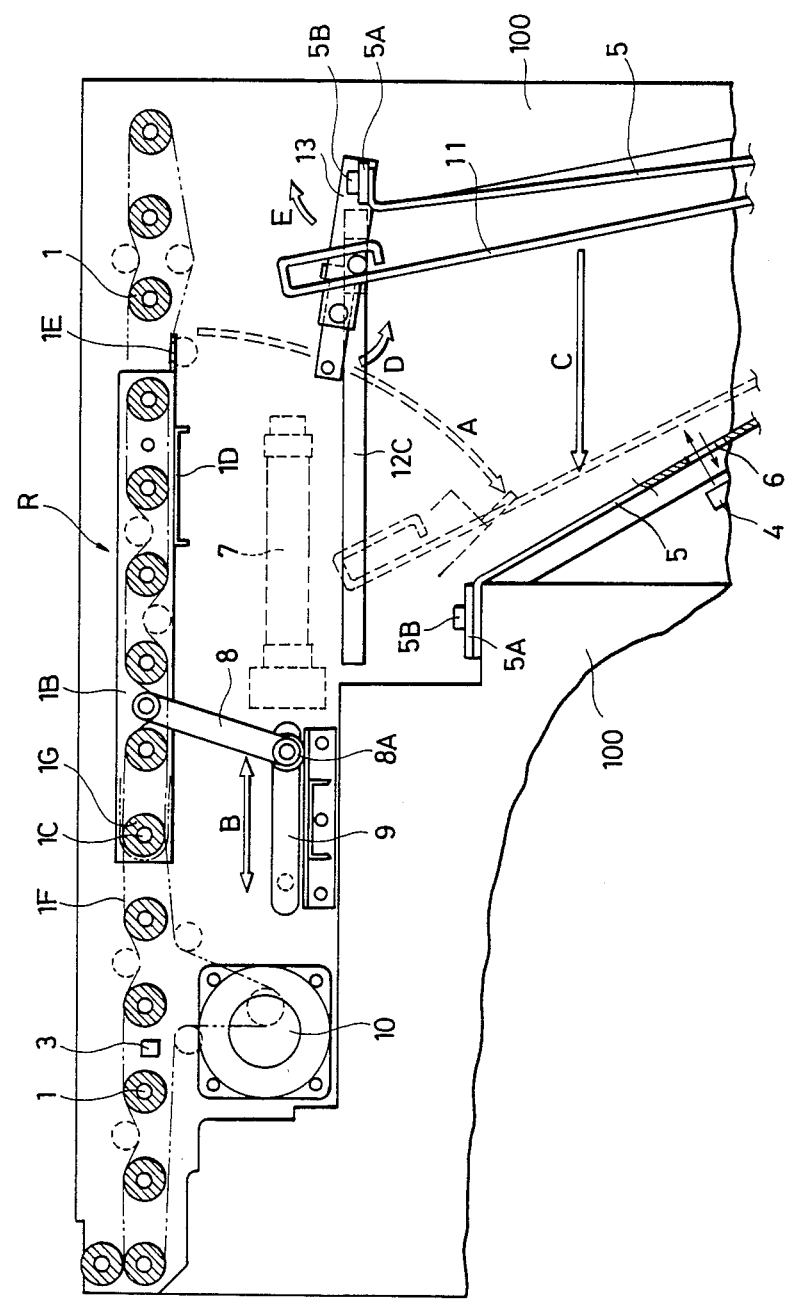
FIG. 3 is a sectional view taken along the line II—II in FIG. 2.

The board transferring part II comprises a plurality of driving rollers 1 as shown in FIGS. 1 to 3.

Along a board transferring path A—A of this transferring mechanism are provided a cover film lifting device, a fluid blowing device, a separating direction determining plate (axially separating plate) for determining a direction in which a cover film is separated from the printed wiring board, and a cover film transferring device (thin film discharging device). Each device is not shown in the drawings. The board transferring part II includes the swingable roller assembly R as a part of the board transferring portion, which is swingably supported by a support frame 1B in a direction indicated by an arrow A and can be disposed in a downwardly inclined position. The support frame 1B is reinforced by a reinforcing member 1b which is provided with a plurality of holes h for decreasing its weight.

At the front end of the support frame 1B is provided a projection 1E for releasing a partition plate controlling member 13 functioning to control the start of moving of a partition plate moving bar 12A.

The swingable roller assembly R is swung by an operating mechanism such as an operating device 7, for example, an air cylinder, an electromagnetic driving device and the like as shown in FIGS. 2 and 3. The operating device 7 functions to move the lower end of a driving lever 8 along a guide member 9 in a direction indicated by an arrow B (left and right directions as viewed in FIG. 3) in order to incline the roller assembly R and return to its original position. The upper end of the driving lever 8 is connected to a predetermined position of the support frame 1B of the swingable roller assembly R.

Each driving roller 1A of the assembly is arranged such that rotation of a pully, fixed to a rotating axis 1c of a driving roller 1G and driven by a driving belt 1F disposed at one end of the roller assembly R, is transmitted to the rotating axis of each driving roller 1A through a plurality of driving belts 1H. The driving belt 1F is driven by a driving motor 10 as shown in FIG. 3.

Further, each driving roller 1, disposed in the front of the driving roller assembly R, is so rotated that rotation of the pulley fixed to the driving roller 1G is transmitted to the rotating axis of each driving roller 1 through a driving belts 1J.

The defective board discharging part IV includes a container 5 comprising a sheet-like member in the shape of a letter V or U, in longitudinal section, under the roller assembly R. The container 5 is formed in such a manner that a flexible and elastic sheet member made of synthetic resin, such as polyamide is bent in the shape of a V or U in order to rotate a butting portion of a side face of the container 5 when a defective board, from which a cover film is not perfectly separated is butted against the side face of the container and so as to prevent the defective boar from impacting the bottom of the container when the detective board is dropped. The two upper ends of the container 5 are fixed to a frame 100 of the main body of the apparatus by screws 5B through two plates 5A, 5A. A sensing window 6 is disposed at a position opposite to that of the sensor 4 shown in FIG. 1.

The container 5 accommodates at least one partition member 11 made of plastic or the like which is automatically moved in the direction opposite to the board transferring direction to assume a position indicated by a dotted line in FIG. 3 under a predetermined condition, e.g., whenever each defective board is accommodated into the container 5.

Figure 4:
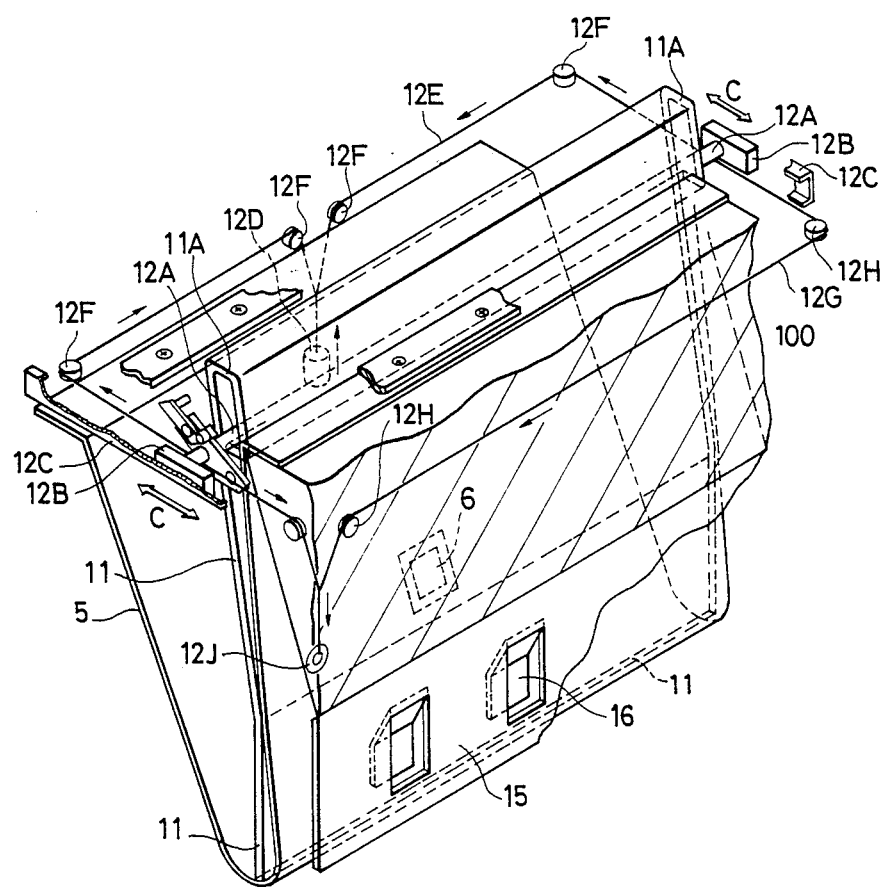
FIG. 4 is a perspective view showing a general construction of defective board accommodating part.

At the upper end of the partition member 11 is provided, e.g., a hollow portion 11A through which a driving bar 12A for moving the partition member 11 passes. The opposite ends of the bar 12A are connected to two support members 12B, 12B which are slidably moved along two guide rails 12C, 12C mounted on the main frame 100 of the apparatus in a direction indicated by an arrow C as shown in FIGS. 3 and 4.

The opposite ends of the driving bar 12A are connected to a wire 12E suspending a weight 12D via a plurality of pulleys 12F for automatically moving the partition member 11 in a direction opposite to the board transferring direction. The opposite ends of the driving bar 12A are also connected to the opposite ends of a wire 12G for returning the partition member 11 to an original position, respectively. The wire 12G suspends a handle 12J at its intermediate position.

Figure 5:
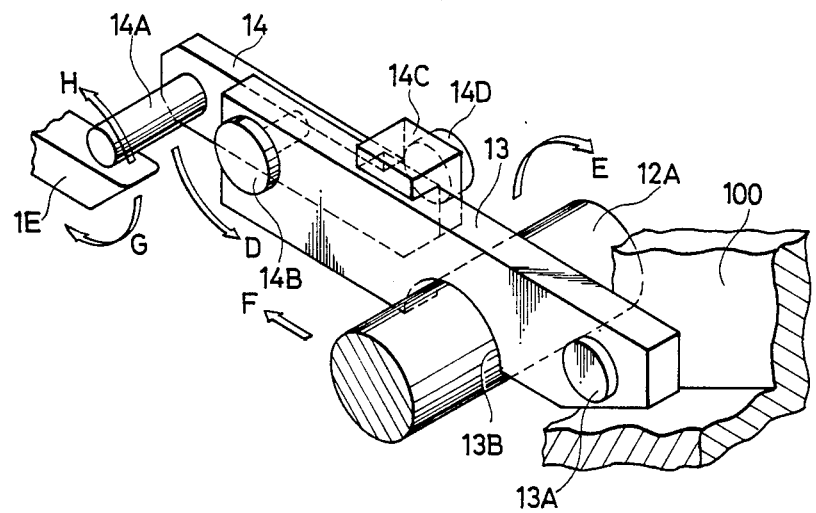
FIG. 5 is an enlarged view of a mechanism for locking and releasing a partition member.

The start of the movement of the driving bar 12A is controlled by the operation of a lock member 13. The lock member 13 is, as shown in FIG. 5, pivotably connected, at its one end, to a frame 100 of the main body of the apparatus through an axis 13A. The lock member 13 has a hook portion 13B at its predetermined position. At the other end of the lock member 13 is rotatably provided, through a fixing axis 14B, a latch member 14 having, at its one end, a lateral projection 14A which abuts against the driving roller assembly R when the assembly r is inclined. At the other end of the latch member 14 is provided a hook portion 14C to which a weight 14D is fixed. That is, when the support frame 1B of the assembly R shown in FIG. 3 is inclined downwardly, the longitudinal projection 1E, provided at the distal end of the assembly R for releasing the lock member 13, is swung in a direction indicated by an arrow G while pushing the lateral projection 14A downwardly to swing the latch member 14 about the fixing axis 14B in a direction indicated by an arrow D against gravity of the weight 14D. When the assembly R is moved to a position indicated by the dotted line shown in FIG. 3, the latch member 14 is released from the longitudinal projection 1E to return to the original position shown in FIG. 5. At the same time, a defective board is dropped into the container 5 along the inclined assembly R.

When the assembly R is returned from the inclined position to the original horizontal position, the lower end 8A of the driving lever 8 connected to a predetermined position of the support frame 1B of the assembly R is moved by the operating device 7 such as the air cylinder, electromagnetic driving device or the like in the right direction of the arrow B-indicated directions. At this time, the longitudinal projection 1E is swung in the arrow H-indicated direction to abut against the hooking projection 14A so that the lock member 13 is swung by pushing force of the projection 1E in the arrow E-indicated direction about the axis 13A.

Further, when the support frame 1B is rotated in an arrow H-indicated direction, the lateral projection 14A is released from the longitudinal projection 1E. When the lock member 13 is rotated in an arrow E-indicated direction, the driving bar 12A is released from the hook portion 13B whereby the driving bar 12A is automatically moved by the weight 12D in an arrow F-indicated direction opposite to the board transferring direction. When the partition member 11 is returned to the original position, the handle 12J for returning the partition member 11 to the original position is pulled.

Figure 6:
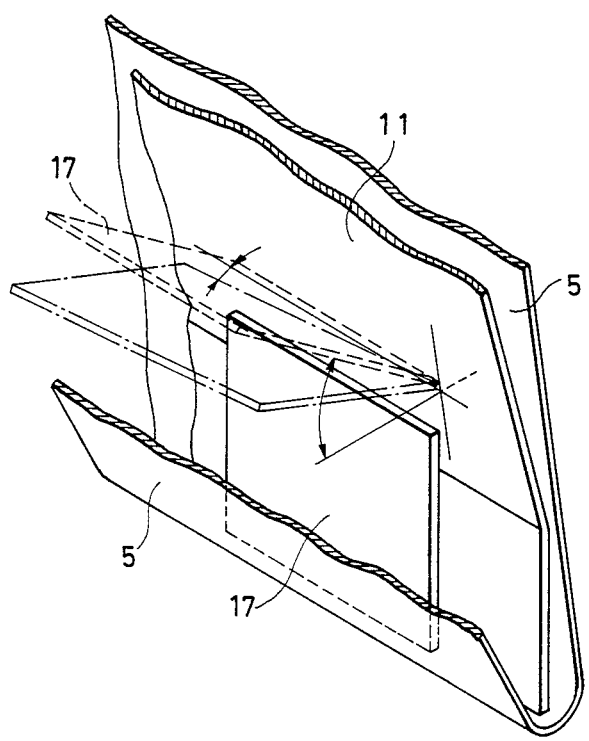
FIG. 6 is an explanatory view showing a motion of the defective board acccommodating part.

As shown in FIGS. 4 and 6, the partition member 11 has a shape of > so that a defective board can be smoothly dropped without impacting fiercely against the side face of the container 5. Control of each part is carried out through sequential or programmed control. The swinging motion of the container 5 at its bottom is restricted by a restriction plate 15 provided along the bottom of the container 5. The plate 15 has two spring plates 16, 16 for alleviating impact between the side wall of the container 5 and the plate 15. A defective board is indicated by a numeral 17 in FIG. 6.

The operation of a cover film separation device of a printed wiring board according to this embodiment for discharging and accommodating a defective board from which a cover film is not separated completely will now be explained.

The cover film of a printed wiring board transferred by the driving rollers 1 is separated therefrom at the cover film separating and transferring part 1. When the cover film is separated therefrom, the cover film sensor 2 detects whether or not the cover film is completely separated from the printed wiring board and a signal of the sensor 2 is transmitted to the control part V. If a printed wiring board is a first defective one from which a film cover is not completely separated, the control part V sends a driving signal to the operating device 7 shown in FIGS. 2 and 3 to drive the operating device. The movement of the operating device moves the lower end 8A of the driving lever 8 connected to the driving roller assembly R along the guide member 9 in the left direction of the arrow B-indicated directions to incline the support frame 1B of the assembly R. When the assembly R is returned to the original horizontal position, the driving lever 8 is moved in the right direction of the arrow B-indicated directions.

When the support frame 1B is inclined and the first defective board 17 abuts against the side face of the partition member 11, the front end of the defective board 17 is dropped onto the bottom of the container 5 while the colliding face of the member 11 is swung. At this time, that its, when the defective board is dropped onto the bottom of the container 5, the impact at that time can be absorbed by the elasticity and the swinging motion of the container 5 because the container 5 is so formed that a sheet-like member made of flexible and elastic synthetic resin such as polyamide is bent in the shape of V or U in longitudinal section. Accordingly, the defective board can be accommodated in the container without damage or breakage of a photosensitive rein layer and sounds of impact between the board 17 and the container 5.

Further, when the first defective board 17 is accommodated in the container 5, the board 17 closes the detecting window 5A to actuate the sensor 4 whereby a detecting signal indicating that the defective board 17 is accommodated in the container 5 is transmitted to the control part V.

In the following step, the lower end 8A of the driving lever 8 connected to a predetermined position of the support frame 1B of the driving roller assembly R is moved along the guide member 9 in the right direction of the arrow B-indicated directions shown in FIG. 3 thereby to return the assembly R from its inclined position to its horizontal position.

When the assembly r is returned to the original position, the longitudinal projection 1E abuts against the lateral projection 14A to swing the lock member 13 about the axis 13A in the arrow E-indicated direction. The rotation of the lock member 13 moves automatically the partition plate moving bar 12A in the arrow F-indicated direction opposite to the board transferring direction under the influence of the weight 12D, so that the partition plate 11 assumes the position indicated by the dotted line shown in FIG. 3.

When a second defective board is detected in a state wherein the partition plate 11 is moved in the direction opposite to the board transferring direction, in the same manner as when the first defective board is detected, a detecting signal indicating a defective board is sent to the control part V. Therefore, the driving device 7 moves the lower end 8A of the driving lever 8 connected to the support frame 1B along the guide member 9 in the left direction of the arrow B-indicated directions thereby to incline the support frame 1B of the driving roller assembly R. When the support frame 1B is inclined, the second defective board 17 abuts against the side wall of the container 5 to swing its abutting face and the front end of the second defective board 17 is dropped onto the bottom of the container 5. Thus, the second defective board is accommodated between the side wall of the container having the abutting face and the partition plate.

In this manner, the provision of the partition plate 11 and its driving means make it possible to accommodate the second defective board into the container 5 without damage or breakage of the photosensitive resin layer of the first defective board having already been accommodated in the container 5. Further, after the second defective board 17 has been already accommodated in the container 5, the driving roller assembly R is returned to the original position to continue a board transferring operation. When the partition plate is returned to the original position after the defective board 17 is discharged, an operator pulls the handle 12J. After the two defective boards are discharged from the container 5 and the partition plate 11 is returned to the original position, if a defective board is further found, the board is judged as a first one to transfer the first one to the container 5.

In addition, in case that two defective boards are not discharged from or picked out of the container 5 after they are accommodated in the container 5, if the sensor 2 detects a third defective board, the driving rollers 1 are stopped automatically when the third defective board is transferred at a position where the defective board is to be stopped.

In this manner, when the third defective board is detected, the sensor 3 can prevent a plurality of defective boards from being accommodated on the partition plate 11 of the container 5 while abutting against each other. Therefore, the defective board can be accommodated in the container 5 without damage or breakage of the photosensitive layer of the defective board.

Figure 7:
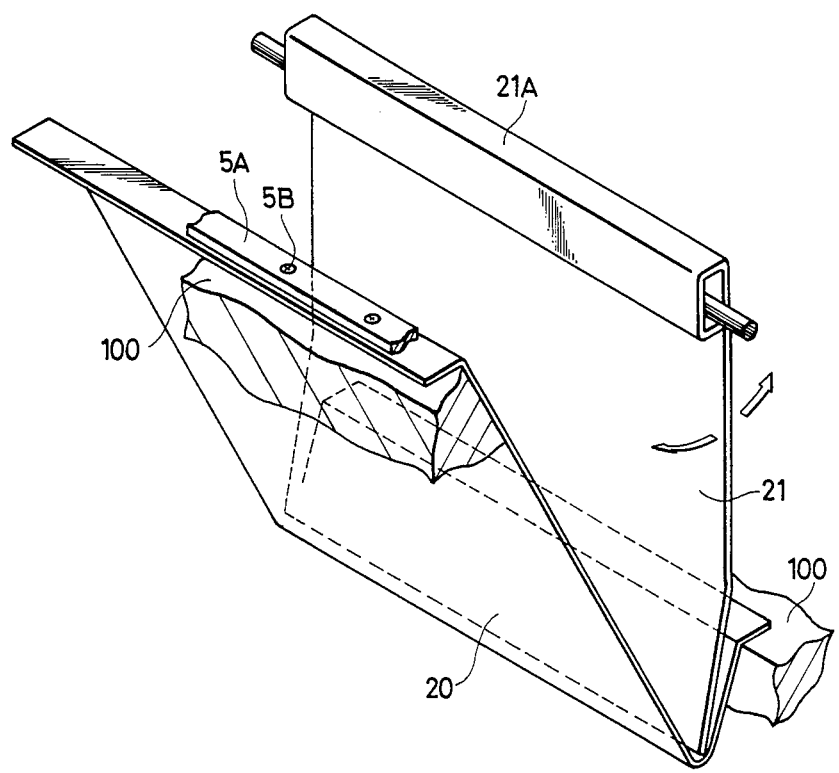
FIG. 7 is another embodiment showing a general construction of a defective board accommodating container.

The container 5 may have other construction if the side face of the container 5 can be swung when a defective board abuts against the side face and if the defective board is not dropped repulsively onto the bottom of the container 5. For example, as shown in FIG. 7 (a perspective view showing a general construction of other embodiment of a container), the container may have such a construction in which a flexible and elastic sheet member made of synthetic resin such as polyamid or the like is bent in the shape of a hook in such a manner that two ends of the sheet member are fixed to the main frame 100 through a keep plate 5A and screws 5B and the lower end of a partition member 21 in the shape of < is put on the bottom of the sheet member while the upper end thereof is fixed swingably to the main frame thereby to form the container in the shape of a letter V or U. The plate 21 may be made of plastic material, etc.

In this embodiment, this invention is adapted to a laminator (thin film laminating device) for making printed wiring boards in a manner that on an insulated board is provided a conductive layer onto which a laminating film comprising a photosensitive resin layer and a cover film for protecting the photosensitive resin layer is thermally pressed. This, the laminator of the second embodiment has the same construction as that of the first embodiment except a sensing means, provided instead of the cover film sensor 2 (FIG. 1) of the first embodiment, for detecting whether or not the laminating film is completely attached or adhered to the board The sensing means of the laminator comprises a photosensor or the like provided along the laminating film transferring path for sensing film transferring condition, that is, whether or not the laminating film is completely adhered to the conductive layer.

The sensing means is not limited to the above sensor if it can detect a defective adherence condition.

In the above, this invention is explained concretely on the basis of the above embodiments and, however, this invention can be variously modified within the scope of this invention According to this invention, the container made of a sheet member formed so as to be in the shape of a letter V or U in section is provided at a downstream portion of the board transferring path. The container is so formed that the side wall thereof is swung when a board to be accommodated in the container abuts against the side wall thereof. Further, the container comprises a flexible and elastic sheet member made of synthetic resin such as polyamide. Therefore, the swinging motion and elasticity of the container bottom can absorb impact of dropping of the board, thereby to enable the board to be accommodated in the container without damage, breakage and impact sound of the board.

In addition, the provision of at least one partition member in the container and the partition member driving means for driving the partition member in a predetermined conditin enable the container to accommodate a plurality of boards with their cover film defective separation therein without collision of boards with each other.

What is claimed is:

1. A printed circuit board selecting and accommodating apparatus for selecting certain printed circuit boards from a plurality of printed circuit boards transferred along a path on the basis of a predetermined standard and accommodating the certain selected printed circuit boards in a container, which comprises:
   a conveying path for conveying said printed circuit boards, the direction of a portion of said conveying path being adjustable from a first position to a second position disposed downwardly with respect to said first position;
   a container for accommodating the selected printed circuit boards, said container comprising a flexible sheet-like member in the shape of a V or U in longitudinal section which is swingably provided under the adjustable portion of the conveyance path when said adjustable portion is disposed in said second position;
   wherein when the selected printed circuit board is conveyed in the container, the selected printed circuit board contacts a side of said flexible container causing said container to swing such that the selected printed circuit board does not impact the bottom of the flexible container and become damaged.

2. A printed circuit board selecting and accommodating apparatus of claim 1, further comprising:
at least one partition member disposed in the container for accommodating at least two selected printed circuit boards on opposing sides of said at least one partition member; and
a partition member rotating means for rotating the partition member between two positions such that each of said at least two printed circuit boards are accommodated on opposing sides of said at least one partition in said container on the basis of a certain condition.

3. A printed circuit board selecting and accommodating apparatus according to claim 2, wherein said container is swingably disposed due to the manner in which the upper end of the container is swingably engaged with the apparatus.

4. A printed circuit board selecting and accommodating apparatus according to claim 2, wherein the bottom of the container is formed in a manner such that the sheet-like member is bent in the shape of the V or U in longitudinal section so as to obtain elasticity and to be swingable.

5. A printed circuit board selecting and accommodating apparatus according to claim 2, wherein the partition member rotating means automatically moves the partition member to a direction opposite to a printed circuit board transferring direction.

6. A printed circuit board selecting and accommodating apparatus according to claim 2, wherein the partition member rotating means is started automatically to move in response to output of a sensor for detecting defective printed circuit boards.

7. A printed circuit board selecting and accommodating apparatus according to claim 2, wherein the partition member rotating means is started automatically to move in response to output of a sensor for detecting defective printed circuit boards and returned to an original position by hand.

8. A printed circuit board selecting apparatus according to claim 1, wherein the container comprises a flexible and elastic sheet-like member made of synthetic resin such as polyamide, synthetic fiber or natural fiber, the sheet-like member being bent to form the V- or U-shape.

9. A printed circuit board selecting and accommodating apparatus according to claim 1, wherein the container comprises a flexible and elastic sheet-like member made of synthetic resin such as polyamide, the opposite ends of the sheet-like member being fixed to form a hook shape in longitudinal section, a plate being disposed at the bottom of the sheet-like member to form the V- or U-shape in longitudinal section.

* * * * *